United States Patent [19]
Fan

[11] Patent Number: 5,921,458
[45] Date of Patent: Jul. 13, 1999

[54] INTEGRATED CIRCUIT SOLDER BALL IMPLANT MACHINE

[76] Inventor: Kuang-Shu Fan, No.3, Alley 57, Lane 456, Tung An Street, Taoyuan City, Taiwan

[21] Appl. No.: 08/882,136

[22] Filed: Jun. 25, 1997

Related U.S. Application Data

[51] Int. Cl.⁶ .......................... B23K 3/006; H01L 21/06
[52] U.S. Cl. ........................ 228/41; 228/246; 118/213
[58] Field of Search ............................. 228/41, 248.1, 228/254, 246; 427/96; 118/213

[56] References Cited

U.S. PATENT DOCUMENTS

| | | | |
|---|---|---|---|
| 4,142,286 | 3/1979 | Knuth et al. | 29/626 |
| 4,203,698 | 5/1980 | Dupuis | 414/404 |
| 4,206,542 | 6/1980 | Reavill | 29/877 |
| 4,733,520 | 3/1988 | Rabbi | 53/559 |
| 4,871,110 | 10/1989 | Fukasawa et al. | 228/245 |
| 5,176,289 | 1/1993 | Klossner et al. | 221/168 |
| 5,431,332 | 7/1995 | Kirby et al. | 228/246 |
| 5,655,704 | 8/1997 | Sakemi et al. | 228/246 |
| 5,704,536 | 1/1998 | Chen et al. | 228/41 |
| 5,782,399 | 7/1998 | Lapastora | 228/41 |
| 5,839,641 | 11/1998 | Teng | 228/41 |

Primary Examiner—Patrick Ryan
Assistant Examiner—Carlos Gamino
Attorney, Agent, or Firm—Rosenberg, Klein & Bilker

[57] ABSTRACT

The invention herein relates to a kind of integrated circuit solder ball implant machine that is mainly comprised of a machine base, a solder ball implant device, a solder ball loading device, an integrated circuit component positioning device and an integrated circuit mold ejection device, the innovations of which includes the utilization of the aforesaid integrated circuit component positioning device that reciprocates leftward and rightward at the lower extent of the solder ball implant device as well as the aforesaid solder ball loading device that is vibrated forward and backward to directly transport the solder balls through the feed holes of the solder ball implant device such that each of the solder balls are reliably, accurately, soundly and expeditiously carried and positioned onto integrated circuit component in the integrated circuit component positioning device. Furthermore, when the ball implant device moves upward during utilization, the module of the aforesaid integrated circuit component positioning device is capable of horizontal movement, and thereby enables the integrated circuit component to be lifted out by the mold ejection device at a set position at the completion of the solder ball implantation onto the integrated circuit component in an operation that is simple, convenient and rapid.

1 Claim, 3 Drawing Sheets

INTEGRATED CIRCUIT SOLDER BALL IMPLANT MACHINE

BACKGROUND OF THE INVENTION

As indicated in FIG. 1, the conventional structure and operational approach of devices that implant solder balls onto integrated circuit components mainly consists of a level platform (1) having an plain module (2) which bears and positions the integrated component (A), and that is comprised of a hinge pin (3) at the upper extent and one end of aforesaid plain module (2) that is connected to a solder ball implant plate (4); after the surface of the integrated circuit component is coated with a rosin solution and placed onto the plain module (2), the aforesaid solder ball implant plate (4) is rotated on the hinge pin (3) to cover the upper extent of the integrated component (A) and, furthermore, maintain an appropriate interval in alignment. Then, the aforesaid solder balls (B) are placed onto the surface of the solder ball implant plate (4) and the operator manually taps the aforesaid plate to cause the aforesaid balls to fall into the implant holes (41) until each of the aforesaid balls has fallen into position on the surface of the integrated component (A). Since the surface of the integrated circuit component is coated with an adhesive, the solder balls (B) are held in position on the integrated circuit component (S) with an appropriate degree of adhesion, with the implant operation onto the integrated component (A) complete after the solder ball implant plate (4) is lifted. Undeniably, this type of integrated circuit solder ball implant method has relative value and effectiveness in terms of time and, furthermore, is currently the most prevalent approach in utilization. However, manufacturers experienced in utilizing the foregoing method are keenly aware that there are numerous shortcomings in actual practice that require improvement. For example, the aforesaid manual tapping to initiate the rolling of the solder balls into the implant holes of the solder ball implant plate not only wastes time and, furthermore, low in efficiency but at the same time, since each integrated circuit component has several hundred implant holes (more than 300 holes), the operating personnel are easily fatigued by long periods of visual operations, which leads to the situation in which it is impossible to implant solder balls into every implant hole. As a result, integrated circuit solder ball implant errors occur at great frequency and since such a situation precludes the achievement of stability, consistency and accuracy, the shortcoming is an even greater increase in the integrated circuit defect rate. Furthermore, following the completion of the solder ball implant operation, since the aforesaid solder ball implant plate separates from the solder balls at an angle during the tapping procedure, the original implant positions of the solder balls are easily distorted or roll out of place due to vibration, which ultimately results in direct impact on the precision and quality of the integrated component.

In view of the foregoing disclosure, the aforementioned conventional means of implanting solder balls onto integrated circuit components is obviously flawed by a number of genuine application shortcomings that require improvement.

SUMMARY OF THE INVENTION

Therefore, the primary objective of the invention herein is to provide a kind of integrated circuit solder ball implant machine, of which the solder ball output slot of the solder ball loading device at upper extent of the solder ball implant device is capable of leftward and rightward reciprocal movement, and the vibrations of a vibrator drives the solder balls contained inside the loading box downward such that when the solder implant operation is conducted, the aforesaid solder balls are rapidly, simply, consistently and accurately delivered into each implant hole, which not only effectively increases actual operations efficiency, but at the same time also directly eliminates the situation of solder ball implant errors and raises the quality of integrated circuit components.

Another objective of the invention herein is to provide a kind of integrated circuit solder ball implant machine, of which the integrated circuit component positioning device at situated at the lower extent of the solder ball implant machine and, furthermore, the positioning module is capable of leftward and rightward movement, and the aforementioned solder ball implant device is capable of a rising and falling movement, such that the integrated circuit component is placed on the positioning module and the aforesaid module is moved to the lower extent of the solder ball module, and during the solder ball implant operation, the solder balls delivered into each implant hole via the aforesaid solder ball module can be smoothly and, furthermore, accurately implanted on the integrated circuit component, and following the completion of the solder ball implant operation, the aforesaid solder ball implant device is capable of rising vertically until the solder ball module ejects the solder balls, such that the solder balls in the completed implant position are not angularly distorted, vibrated, displaced or rolled of out position, which effectively ensures accuracy and stationary positioning.

Yet Another objective of the invention herein is to provide a kind of integrated circuit solder ball implant machine, of which the aforesaid machine base is equipped with supportive air pressure cylinders that produce the upward and downward movement of the integrated circuit mold ejection device at the completion the integrated circuit component solder ball implant operation and, furthermore, after the positioning module of the integrated circuit component positioning device is moved to a set position, the upward movement of the aforesaid air pressure cylinders is utilized to stably lift the aforesaid integrated circuit component, which thereby provides the operator with simple, convenient and rapid removal performance.

To enable the examination committee to have a further understanding and recognition of the objectives, innovations and functions of the invention herein, the brief description of the drawings and the detailed description of the invention are attached below.

DETAILED DESCRIPTION OF THE INVENTION

Figure 1:
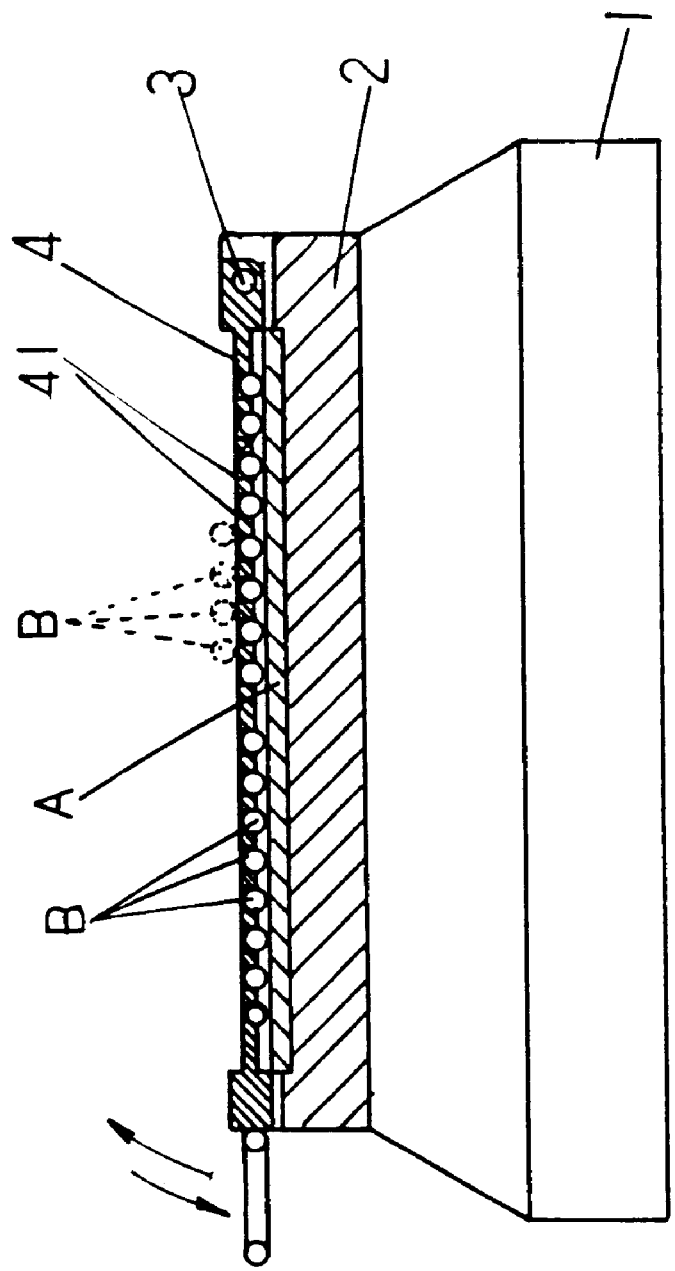
FIG. 1 is an orthographic drawing of a conventional solder ball implant operation.
Figure 2:
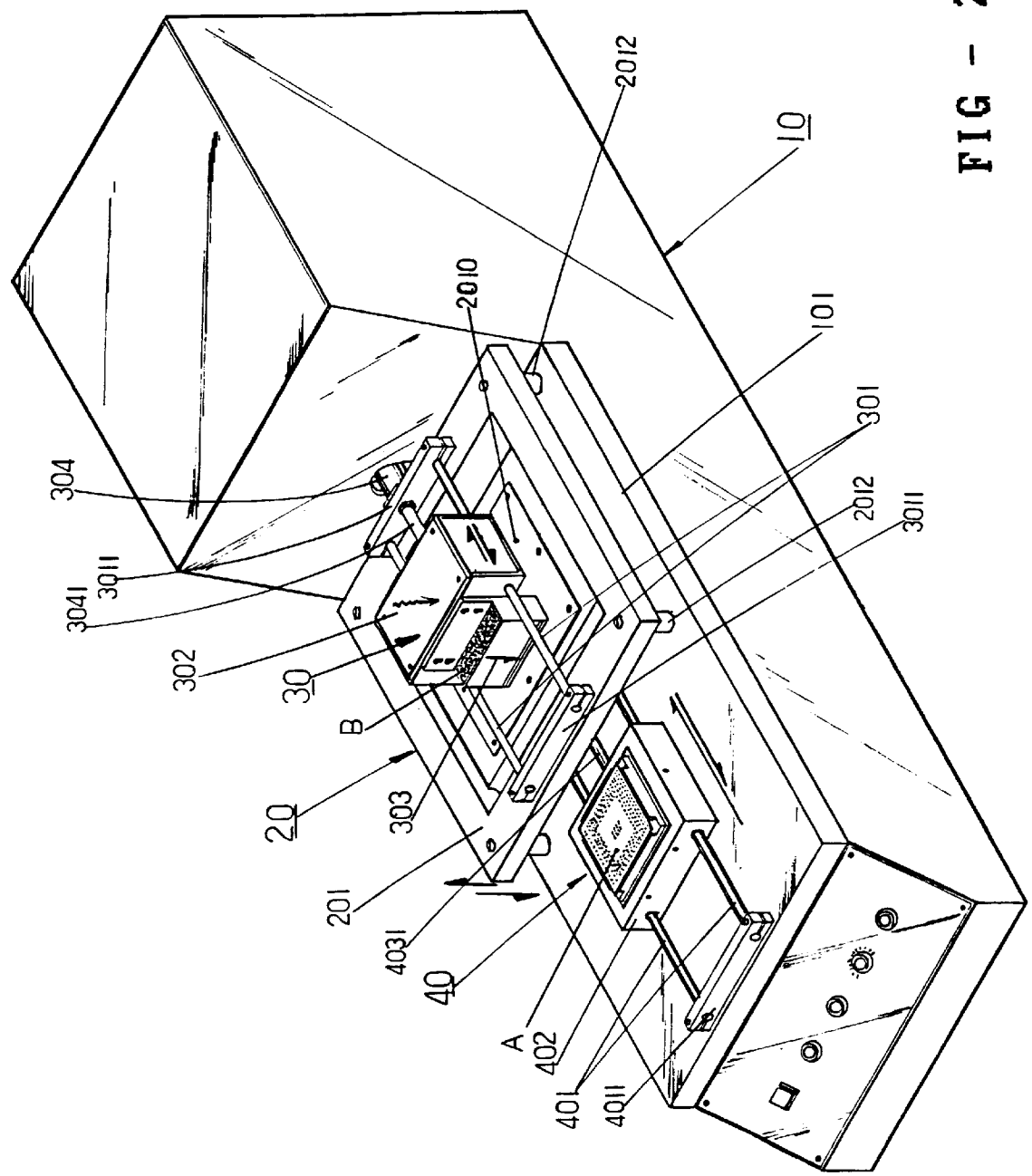
FIG. 2 is an isometric drawing of the invention herein.
Figure 3:
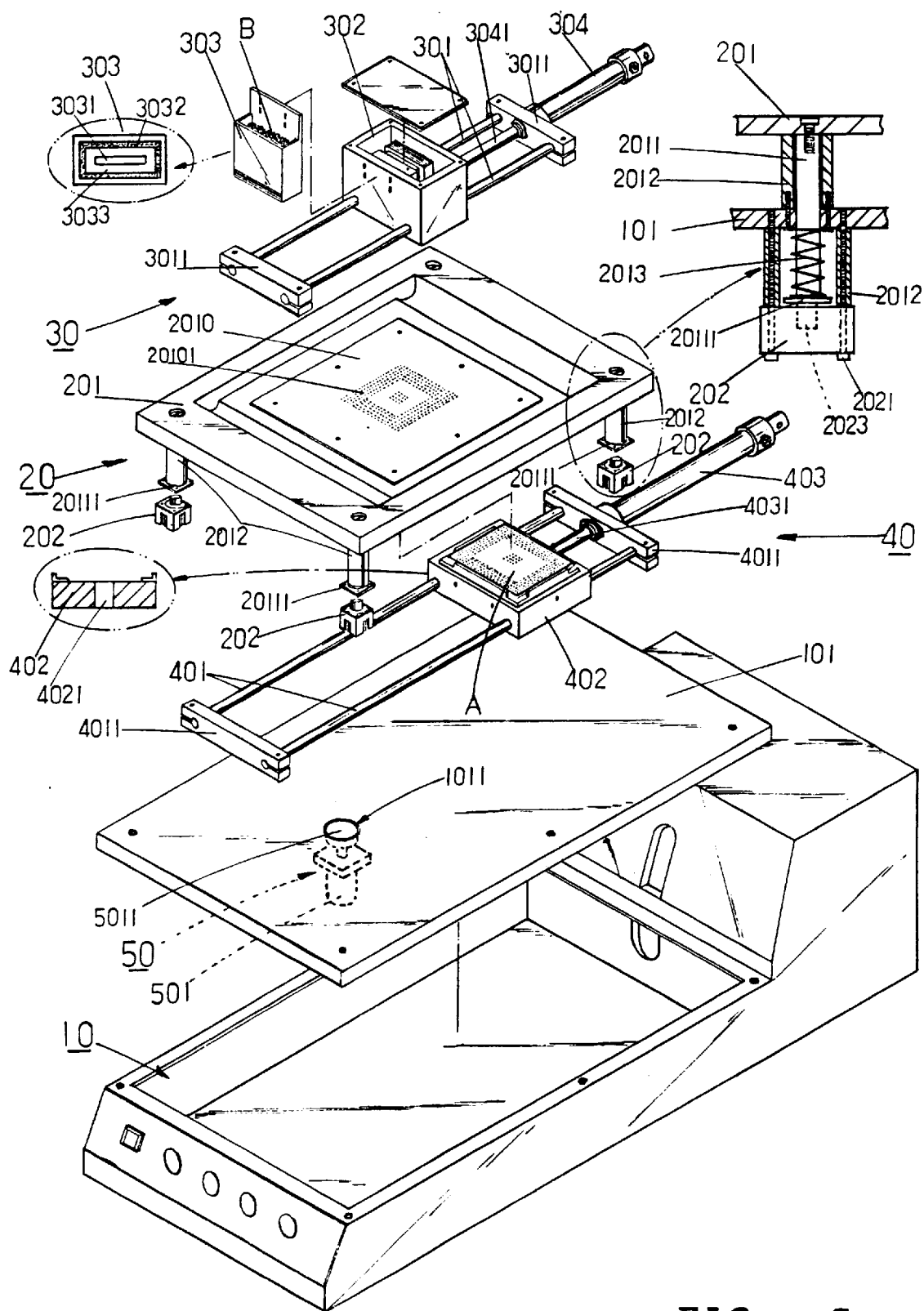
FIG. 3 is an isometric exploded drawing of the invention herein.

Referring to FIG. 2 and FIG. 3, the invention herein is a kind of integrated circuit solder ball implant machine that is mainly comprised of a machine base (10), a solder ball implant device (20), a solder ball loading device (30), an integrated circuit component positioning device (40) and an integrated circuit mold ejection device (50), of which:

The aforementioned machine base (10) is a rectangular body that provides for the installation and mounting of the following devices.

The aforementioned solder ball implant device (20) is equipped with bottom base (201) and has a solder ball implant module (2010) installed at the center; furthermore, the aforesaid solder ball implant module (2010) is profiled according to the solder ball layout of an integrated circuit component and is designed with a number of solder ball implant holes (20101) and guide rods (2011) at the underside of each of the four corners and, furthermore, the aforesaid guide rods (2011) are inserted upwards into the lower extent of the machine base carrier plate (101) and, furthermore, the sleeves (2012) are inserted onto the upper extent of the aforesaid carrier plate (101), on the lower extent of which are inserted coil springs (2013) and the lower end of the coil springs (2013) are supported by flanged edges (20111) at the bottom section such that there is a constant downward pressure against the guide rods (2011) and the bottom base (201); four air pressure cylinders (202), of which one each is positioned on the lower sections of the guide rods (2011) and, furthermore, after the screws (2021) are respectively inserted to fasten and directly mount the lower sleeves (2022) into position on the carrier plate (101) of the aforesaid machine base, the piston rods (2023) inside are enabled to rise and fall and, furthermore, the aforesaid movement causes the guide rods (2011) and bottom base (201) to rise and fall vertically.

The aforementioned solder ball loading device (30) is positioned exactly over the upper extent of the solder ball implant device (20) and has two guide rails (301) with a tie rod (3011) at each end and, furthermore, is installed in between the two ends of the bottom base (201) of the solder ball implant device (20); a vibrator (302) is inserted onto the two guide rails (301) and positioned on one side of the vibrator (302) is a solder ball loading box (303) that supplies solder balls (B) contained inside during implant operations and which has a rectangular shaped solder ball output slot (3031) at the bottom section and is designed with a brush section (3032) near the edges of the aforesaid output slot and that, furthermore, forms a container space (3033) and, furthermore, the aforesaid brush section (3032) is in slight contact with the solder ball implant module (2010) of the solder ball implant device (20); an air pressure cylinder (304) that is installed at one tie rod (3011) of the two guide rails (301), with the piston rod (3041) attached to the vibrator (302) such that during extension and retraction motion, movement is conveyed to the vibrator (302) and the solder ball loading box (303) at the upper extent of the solder ball implant module (2010) and the force of vibration drives the solder balls (B) contained in the solder ball loading box (303) to drop down into the solder ball implant holes (20101) of the solder ball implant module (2010).

The aforementioned integrated circuit component positioning device (40) is positioned at the lower extent of the solder ball implant device (20) and has two guide rails (401) with a tie rod (4011) at each end and, furthermore, is installed in between the two ends of the carrier plate (101) of the aforesaid machine base (10); a positioning module (402) is inserted onto the two guide rails (401), provides for holding the integrated circuit (A) in position, and has a vertically oriented guide hole (4021) in the center; an air pressure cylinder (403) is installed at the end of one tie rod (4011) of the two guide rails (401) and the piston rod (4031) is attached to the integrated circuit positioning module (402) such that during extension and retraction motion, movement is conveyed to the positioning module (402) at the lower extent of the solder ball implant module (2010).

The aforementioned (50) integrated circuit mold ejection device (50) is installed on one end at the lower extent of the carrier plate (101) of the machine base (10) and has an air pressure cylinder (501), of which the piston rod (5011) can be move to a set position by an upward and downward movement through the guide hole (1011) in the carrier plate (101) of the machine base (10), and can be separated from the lower extent of the solder ball implant module (2010) at the positioning module (402) of the integrated circuit component positioning device (40) such that when moved to the set position, the piston rod (5011) is inserted into the guide hole (4021) of the positioning module (402).

When the aforementioned structure of the invention herein is utilized, since the brush section (3032) at the bottom section of the solder ball loading box (303) of the solder ball loading device (30) is in a state of slight contact with the solder ball implant module (2010) of the solder ball implant device (20), therefore, prior to the solder ball implant operation, when the bottom section of the container space (3033) is not aligned with the implant holes (20101) of the solder ball implant module (2010), the solder balls (B) contained in the aforesaid solder ball loading box (303) do not emerge; furthermore, since the solder ball implant device (20) can be controlled to execute a rising and falling movement, and the positioning module (402) of the aforesaid integrated circuit component positioning device (40) is capable of leftward and rightward movement, therefore, when an integrated circuit solder ball implant operation is to be performed, the piston rods (2023) of the four air pressure cylinders (202) of the solder ball implant device (20) first extend and retract, enabling the alignment of the guide rods (2011) to become higher than the top of the bottom base (201) and at the same time, the air pressure cylinder (403) of the aforesaid integrated circuit component positioning device (40) causes the piston rod (4031) to extend outward, which in turn pushes the positioning module (402) outwards and consequently separate from the lower extent of the bottom base (201); after the integrated circuit component (A) is placed on the positioning module (402), then the piston rod (4031) of the air pressure cylinder (403) of the aforesaid positioning device (40) is retracted, and the positioning module (402) carrying the integrated circuit component (A) moves to the set position at the lower extent of the ball module (2010), and the air pressure cylinder (202) of the solder ball implant device (20) is retracted until the ball module (2010) on the bottom base (201) is subjected to the tensile force of the coil springs (2013) and directly descends until the minute interval (approximately one-fourth the diameter of the solder balls) between the ball module (2010) and the integrated circuit component (A) is aligned with the set position; the air pressure cylinder (304) of the solder ball loading device (30) can be moved forward and backward, with the aforesaid vibrator (302) on the solder ball loading box (303) serving as the motive force of the forward and backward movement such that the solder balls (B) contained in the solder ball loading box (303) are shaken out by the continuous vibration of the vibrator (302) and, furthermore, the downward force applied for the duration of the process is such that container space (3033) at the bottom section of the solder ball loading box (303) during the movement becomes aligned with the solder ball implant holes (20101) of the ball module (2010) and of course, the aforesaid solder balls (B) inside are subjected to a downward force and smoothly, accurately and rapidly ejected into the aforesaid solder ball implant holes, and when passing back and forth across the brush section (3032), all of the aforesaid implant holes (20101) accurately implant the solder balls (B) with no occurrence of erroneous implant and inconsistency, and without damaging the aforesaid solder balls (B);

furthermore, since the integrated circuit (A) is placed in the positioning module (402) of the integrated circuit component positioning device (40) situated at the set position at the lower extent of the solder ball module (2010), the aforesaid ejection of the solder balls (B) into the implant holes (20101) are smoothly, accurately and rapidly ejected and, furthermore, implanted onto the integrated circuit component (A) to simply, conveniently, rapidly, precisely and consistently to complete the solder ball implant operation.

Following the aforementioned implantation of the solder balls (B) onto the integrated circuit component, the air pressure cylinders (202) of the solder ball implant device (20) are moved upward at the appropriate time and, furthermore, the solder ball module (2010) on the bottom base (201) are moved upward vertically, and then the aforesaid solder ball module (2010) subsequently separates from the solder balls (B) implanted on the integrated component (A) in a vertical movement that is unlike the slanted angle of separation in conventional devices of the prior art and of course, unlike the conventional devices of the prior art, the solder balls (B) originally implanted on the integrated circuit (A) are not contacted or displaced by rolling due to vibration, but effectively enhances the quality, precision and stability of the integrated circuit component.

Following the upward movement of the solder ball implant device (20), the air pressure cylinder (403) of the integrated circuit component positioning device (40) is extended outward and, furthermore, the integrated circuit component positioning device (40) is pushed outward until the mold ejection device (50) is aligned with the set position, and the air pressure cylinder (501) of the aforesaid integrated circuit mold ejection device (50) is activated at the appropriate time until the piston rod (5011) moves upward and, furthermore, is inserted into the guide hole (4021) pre-positioned in the aforesaid positioning module (402) and lifts the integrated circuit (A), then the operator removes the integrated circuit component after the solder ball implantation is completed in an efficient procedure that is convenient, simple, rapid and smooth.

What is claimed is:

1. An integrated circuit solder ball implant machine comprising a machine base having a carrier plate, a solder ball implant device coupled to said machine base carrier plate, a solder ball loading device coupled to said machine base carrier plate, an integrated circuit component positioning device coupled to said machine base carrier plate and an integrated circuit mold ejection device coupled to said machine base carrier plate through a guide hole formed therein;

said solder ball implant device being equipped with a bottom base and having a solder ball implant module located at a center portion thereof, said solder ball implant module being shaped in correspondence with a solder ball layout of an integrated circuit component and has a number of solder ball implant holes, said solder ball implant module having guide rods disposed at an underside of each of four corner portions thereof, said guide rods being coupled to a lower extent of said machine base carrier plate and a plurality of sleeves are located on an upper extent of said carrier plate, a plurality of coil springs are respectively positioned within a lower end of said plurality of sleeves, a lower end of each of said coil springs is supported by flanged edges formed at a bottom section of said spring, four air pressure cylinders are respectively positioned on a lower section of said guide rods, each said air pressure cylinder having a piston rod therein enabled to rise and fall and thereby cause said guide rods and said bottom base to rise and fall vertically;

said solder ball loading device being positioned exactly over an upper extent of said solder ball implant device and having two guide rails with a tie rod at each end thereof, said solder ball loading device being installed between two ends of said bottom base of said solder ball implant device, said solder ball loading device including a vibrator mounted to said two guide rails, a solder ball loading box that supplies said solder balls is positioned on a side of said vibrator, said solder ball loading box having a rectangular shaped solder ball output slot formed in a bottom section thereof and having a brush section disposed adjacent respective edges of said output slot, said brush section being in slight contact with said solder ball implant module of said solder ball implant device, an air pressure cylinder being installed at one of said tie rods of said two guide rails, said air pressure cylinder having a piston rod attached to said vibrator for conveying an extension and retraction motion to said vibrator and a force of vibration driving solder balls contained in said solder ball loading box to drop down into the solder ball implant holes of said solder ball implant module;

said integrated circuit component positioning device being positioned at a lower extent of said solder ball implant device and includes two guide rails with a tie rod at each end thereof, said integrated circuit component positioning device being installed between two respective ends of said carrier plate of said machine base, a positioning module is disposed on said two guide rails of said integrated circuit component positioning device for holding an integrated circuit in position and has a vertically oriented guide hole in a center thereof, a second air pressure cylinder being installed at an end of one of said tie rods of said two guide rails of said integrated circuit component positioning device, and a piston rod being attached to said integrated circuit positioning module for conveying an extension and retraction motion to said positioning module;

said integrated circuit mold ejection device being installed in said lower extent of one end of said carrier plate of said machine base and includes a third air pressure cylinder, said third air pressure cylinder having a piston rod positioned for upward and downward movement through a guide hole of said carrier plate of said machine base and into said guide hole of said integrated circuit component positioning device.

* * * * *